United States Patent [19]
Wakamori et al.

[11] Patent Number: 5,788,448
[45] Date of Patent: Aug. 4, 1998

[54] PROCESSING APPARATUS

[75] Inventors: Tsutomu Wakamori, Machida; Hiroyuki Iwai, Sagamihara; Katsuhiko Mihara, Hachioji, all of Japan

[73] Assignee: Tokyo Electron Limited, Tokyo, Japan

[21] Appl. No.: 568,335

[22] Filed: Dec. 6, 1995

[30] Foreign Application Priority Data

Dec. 8, 1994 [JP] Japan ................................. 6-331038
Apr. 21, 1995 [JP] Japan ................................. 7-120857

[51] Int. Cl.⁶ ............................................... H01L 21/00
[52] U.S. Cl. ........................ 414/222; 414/416; 414/937; 414/939; 414/940
[58] Field of Search .................... 414/217, 222, 414/939, 940, 937, 416, 331

[56] References Cited

U.S. PATENT DOCUMENTS

| | | | |
|---|---|---|---|
| 5,261,935 | 11/1993 | Ishii et al. | 414/940 X |
| 5,273,423 | 12/1993 | Shiraiwa | 414/939 X |
| 5,277,579 | 1/1994 | Takanabe | 414/940 X |
| 5,303,671 | 4/1994 | Kendo et al. | 414/939 X |
| 5,433,785 | 7/1995 | Saito | 414/939 X |
| 5,462,397 | 10/1995 | Iwabuchi | 414/940 X |
| 5,464,313 | 11/1995 | Ohsawa | 414/940 X |
| 5,468,112 | 11/1995 | Ishii et al. | 414/940 X |
| 5,527,390 | 6/1996 | Ono et al. | 414/940 X |
| 5,562,383 | 10/1996 | Iwai et al. | 414/940 X |

FOREIGN PATENT DOCUMENTS

| | | |
|---|---|---|
| 5-114567 | 5/1993 | Japan. |
| 5-114568 | 5/1993 | Japan. |
| 6-77152 | 3/1994 | Japan. |
| 6-224143 | 8/1994 | Japan. |
| 6-224144 | 8/1994 | Japan. |
| 6-224145 | 8/1994 | Japan. |

*Primary Examiner*—David A. Bucci
*Attorney, Agent, or Firm*—Beveridge, DeGrandi, Weilacher & Young, LLP

[57] ABSTRACT

A processing apparatus is provided with a reaction furnace for subjecting semiconductor wafers, which are objects to be processed, to a predetermined processing; a storage rack for storing carriers (wafer cassettes), each containing a predetermined number of semiconductor wafers; and a conveyor for conveying the carriers into and out of the reaction furnace and the storage rack. In this case, a second conveyor mechanism, which comprises the storage portion and at least part of the conveyor, and a third conveyor mechanism are disposed within a sealed chamber in such a manner that they are isolated from the outer atmosphere. An exchange chamber that can be isolated from the outer atmosphere is further provided, for temporarily storing carriers that are to be conveyed into or out of the storage portion, through the sealed chamber via a communicating port. The interiors of the sealed chamber and the exchange chamber are formed so that they can be supplied with nitrogen. This ensures that unprocessed and processed semiconductor wafers can be held in an inert gas environment, so that contamination of the semiconductor wafers by organic substances and heavy metals can be prevented.

6 Claims, 12 Drawing Sheets

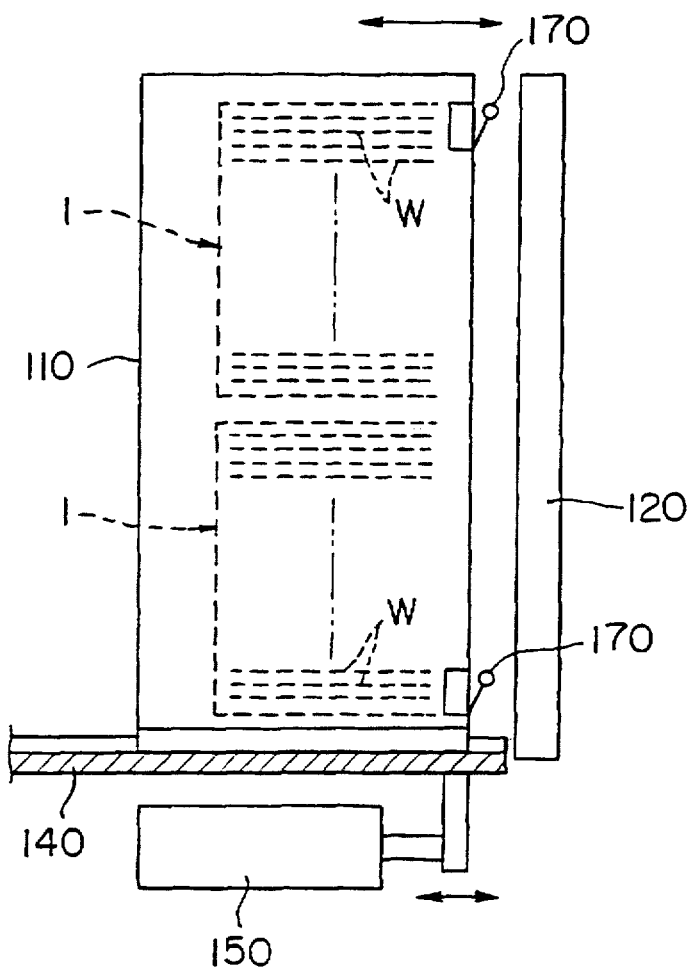
F I G. 12 A
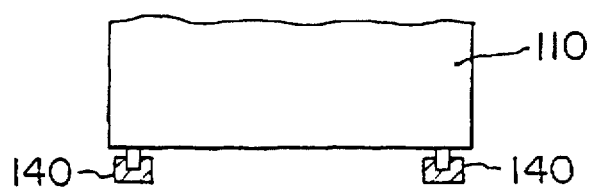
F I G. 12 B

PROCESSING APPARATUS

BACKGROUND OF THE INVENTION

The present invention relates to a processing apparatus.

During the process of fabricating a semiconductor device, various types of processing apparatus, such as chemical vapor deposition (CVD) apparatuses, oxide film formation apparatuses, and diffusion apparatuses, are used in the prior art for forming thin films and oxide films on the surface of a semiconductor wafer that is an object to be processed (hereinafter abbreviated to "wafer"), or diffusing impurities thereinto.

In such a processing apparatus, a plurality of wafers, such as 25 wafers, is conveyed together in a state in which they are accommodated within a carrier (wafer cassette). Wafers that have been subjected to a lithographic process, for example, are conveyed by a conveyor robot to the vicinity of a reaction furnace for thermal processing, while accommodated in such a carrier. The wafers are transferred by another conveyor robot from the carrier to a wafer boat, until the wafer boat contains a large number of wafers, such as 100 wafers, whereupon it is conveyed into the reaction furnace where a thermal process such as oxidation or diffusion is performed. Wafers that have been subjected to this thermal processing are transferred from the wafer boat to carriers which are then passed to a conveyor robot which conveys them to another location.

To ensure that this thermal processing is performed efficiently on the wafers, a processing system is employed in which a storage portion is provided at a predetermined location in the vicinity of the reaction furnace, for storing carriers that contain wafers or empty carriers. Carriers for containing unprocessed wafers and carriers for containing processed wafers are held separately in this storage portion.

However, this prior-art type, of processing apparatus has a problem in that wafers remain for a long time in the clean room and processing apparatus within the semiconductor factory, so that they can easily become contaminated by organic substances or heavy metals such as phosphorous or boron, and this contamination of the wafers leads to a deterioration in the yield of completed products.

SUMMARY OF THE INVENTION

The present invention was devised in the light of the above problems and has as an objective thereof the provision of a processing apparatus that actively controls the environment in which the objects to be processed are held within the semiconductor fabrication apparatus, to prevent contamination by organic substances or heavy metals of the objects to be processed, and also to increase the yield of completed products.

In order to achieve the above objective, the processing apparatus of this invention comprises a processing means for subjecting objects to be processed to a predetermined processing; a storage portion for storing carriers, each of these carriers accommodating a plurality of objects to be processed; and a conveyor means for transferring carriers into and out of the processing means and the storage portion. A sealed chamber is provided to isolate the storage portion and at least part of the conveyor means from the outer atmosphere, and also an exchange chamber is provided communicating with the sealed chamber, for temporarily storing the carriers to be conveyed into and out of the storage portion in an environment isolated from the outer atmosphere, so that the interiors of the sealed chamber and the exchange chamber can be kept constantly filled with an inert gas.

In accordance with the processing apparatus of this invention, the sealed chamber in which the carriers containing objects to be processed are stored and the exchange chamber communicating with this sealed chamber are isolated from the outer atmosphere, and an inert gas is always supplied to the interiors of the sealed chamber and the exchange chamber. Thus the environment of the objects to be processed within the processing apparatus can be maintained as an inert gas environment. As a result, the objects to be processed can be prevented from contamination by organic substances and heavy metals, and the yield of completed products can be expected to increase.

BRIEF DESCRIPTION OF THE DRAWINGS

FIGS. 12A and 12B are a schematic side view of the first storage chamber of FIG. 11 and a partial side view illustrating how the box-shaped main unit thereof is disposed on guide rails;

DESCRIPTION OF THE PREFERRED EMBODIMENTS

Preferred embodiments of the processing apparatus of this invention will be described below with reference to the accompanying drawings. The description relates to the application of the processing apparatus of this invention to a vertical processing apparatus for semiconductor wafers.

First Embodiment

Figure 1:
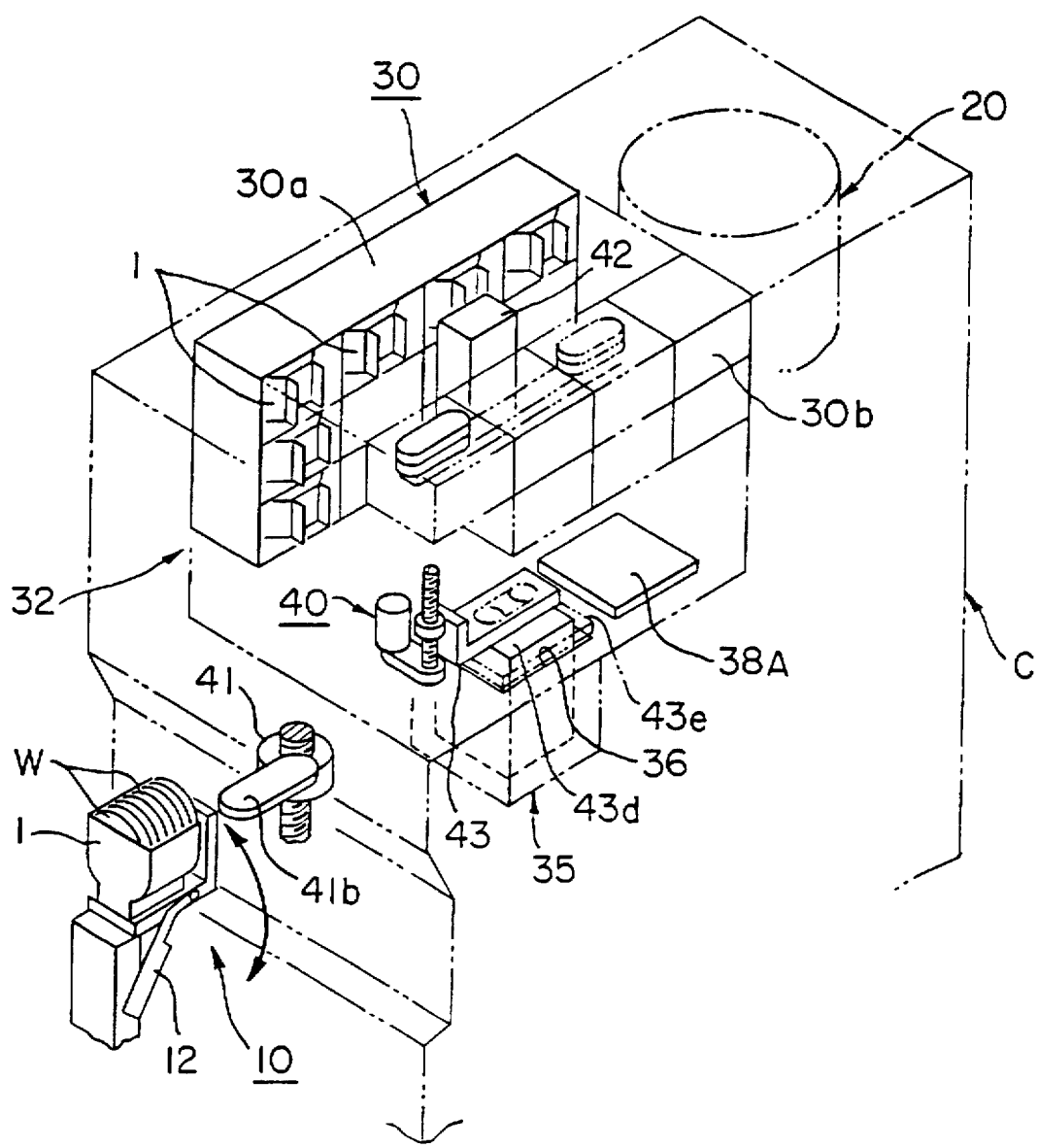
FIG. 1 is a schematic perspective view of a first embodiment of the processing apparatus of the present invention.
Figure 2:
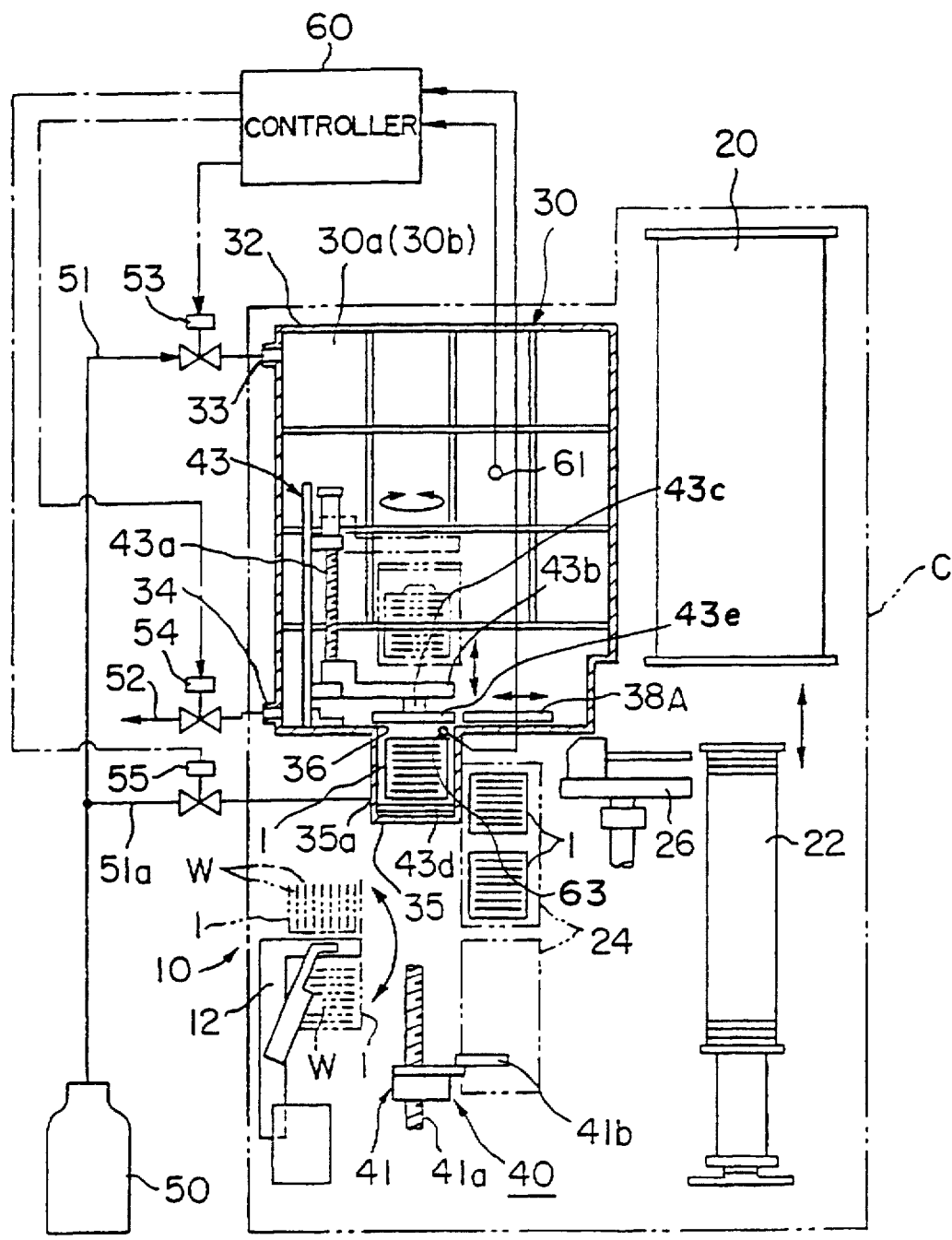
FIG. 2 is a schematic cross-sectional view of the processing apparatus of FIG. 1.

A schematic perspective view of a first embodiment of the processing apparatus of the present invention is shown in FIG. 1, with a schematic cross-sectional view thereof shown in FIG. 2. In these drawings, parts of a casing C and a sealed chamber 32 are indicated by broken lines.

The vertical processing apparatus described above comprises an entrance/exit portion 10 for carriers (wafer cassettes) 1, each of theses carriers 1 accommodating a number of semiconductor wafers W (hereinafter referred to simply as "wafers") such as 25 wafers; a reaction furnace 20 that is a means for subjecting the wafers to a predetermined process; a wafer boat 22; a storage portion 30 for storing carriers 1 accommodating unprocessed wafers W and processed wafers W at a location between the entrance/exit portion 10 and the reaction furnace 20; and a conveyor means 40 for moving the carriers 1 into and out of the entrance/exit portion 10, the reaction furnace 20, and the storage portion 30. These main components are accommodated as a unit within the casing C.

A carrier reorientation mechanism 12 is provided within the entrance/exit portion 10 for changing the orientation of the carriers 1. This carrier reorientation mechanism 12 is configured in such a manner that it either takes a carrier 1 that contains a plurality of wafers W (such as 25 waffers) in a vertical orientation and rotates it downward through 90 degrees to change the orientation of the wafers W to horizontal, or it takes a carrier 1 accommodating wafers W in a horizontal orientation and rotates it upward through 90 degrees to change the orientation of the wafers W to vertical.

A first storage rack 30a for storing a plurality of carriers 1, such as 12 carriers, and a second storage rack 30b for storing a number of carriers 1, such as seven carriers, are disposed within the storage portion 30. These first and second storage racks 30a and 30b are arranged parallel to one another at a predetermined spacing, and they are arranged within the sealed chamber 32 to ensure they are isolated from the outer atmosphere.

A supply port 33 and an exhaust port 34 for an inert gas such as nitrogen are provided for the sealed chamber 32, as shown in FIG. 2. A nitrogen supply source 50 is connected to the supply port 33 by a supply pipe 51, and an exhaust pipe 52 is connected to the exhaust port 34. Switching control valves 53 and 54 are provided partway along the nitrogen supply pipe 51 and the exhaust pipe 52, respectively, as means of opening and closing these pipelines.

The configuration is such that the degree of opening of each of these switching control valves 53 and 54 is controlled by control signals from a controller 60. In this case, the controller 60 is configured to receive a detection signal from an oxygen concentration detection sensor 61 (concentration detection means) that is provided within the sealed chamber 32 to detect the concentration of oxygen therein, compare that signal with previously stored information, and send appropriate control signals to the switching control valves 53 and 54. Thus the interior of the sealed chamber 32 always has a nitrogen environment supplied from the nitrogen supply source 50. If the oxygen concentration within the sealed chamber 32 exceeds a predetermined value, the controller 60 receives a detection signal from the oxygen concentration detection sensor 61 and sends control signals to the switching control valves 53 and 54 to control those valves so that nitrogen at an appropriate pressure and flowrate is supplied to the interior of the sealed chamber 32. This ensures that any oxygen and water vapor within the sealed chamber 32 are swept up by the supplied nitrogen and exhausted to the outside through the exhaust pipe 52. When the oxygen concentration in the sealed chamber 32 falls below the predetermined value as a result of this process, the switching control valves 53 and 54 are closed by control signals from the controller 60, thus stopping the supply of nitrogen.

Since the carrier storage portions within the sealed chamber 32 are purged with an inert gas as described above, so that unwanted gases such as oxygen and water vapor are exhausted therefrom, oxides and other unwanted substances can be prevented from forming on the wafers W contained in the carriers 1. Therefore the wafers W are transferred from the storage portion into other parts of the apparatus, such as the reaction furnace 20, in a state in which they are free of natural oxide films.

Figure 3:
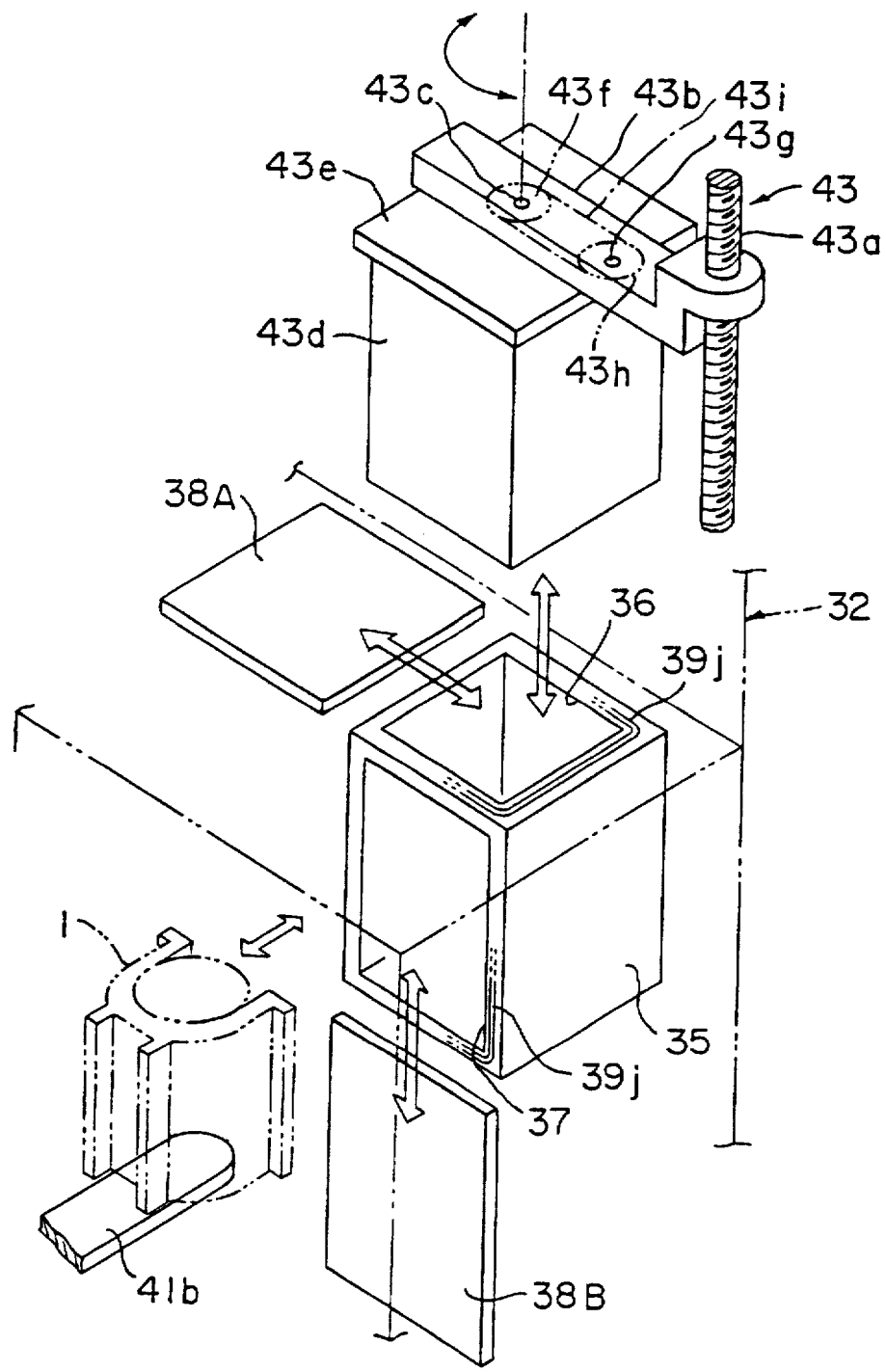
FIG. 3 is a perspective view of an exchange chamber of the processing apparatus of FIG. 1, showing the state in which a carrier is conveyed into and out of this chamber.

A box-shaped exchange chamber 35 is provided communicating with a base portion of the sealed chamber 32, with a rectangular communicating port 36 therebetween, as shown in FIG. 3. A rectangular aperture 37 for the conveying of carriers 1 is provided in one side surface of this exchange chamber 35, with the configuration being such that the carriers 1 are conveyed into and out of the exchange chamber 35 through the aperture 37. Doors 38A and 38B are provided for the communicating port 36 and the aperture 37, respectively, in such a manner that they can be opened and closed in the horizontal and vertical directions, respectively, by separate drive mechanisms. The interior of the sealed chamber 32 is isolated from the outer atmosphere by the closing of the communicating port 36 by the door 38A, and the interior of the exchange chamber 35 is isolated from the outer atmosphere by the closing of the aperture 37 by the door 38B.

A nitrogen supply port 35a is provided in the exchange chamber 35, as shown in FIG. 2, and the nitrogen supply source 50 is connected to the nitrogen supply port 35a by a nitrogen supply pipeline 51a. A switching control valve 55 is provided partway along the nitrogen supply pipeline 51a as a control means that is controlled by the controller 60. In the same manner as that with the sealed chamber 32, the configuration is such that the degree of opening of the switching control valve 55 is controlled by control signals from the controller 60 so that an environment of a suitable inert gas is maintained in the interior of the exchange chamber 35. Note that an oxygen concentration sensor 63 could be provided in the exchange chamber 35 in this case too, so that the oxygen concentrations in this chamber and the sealed chamber 32 could be detected and controlled independently.

Figure 4A:
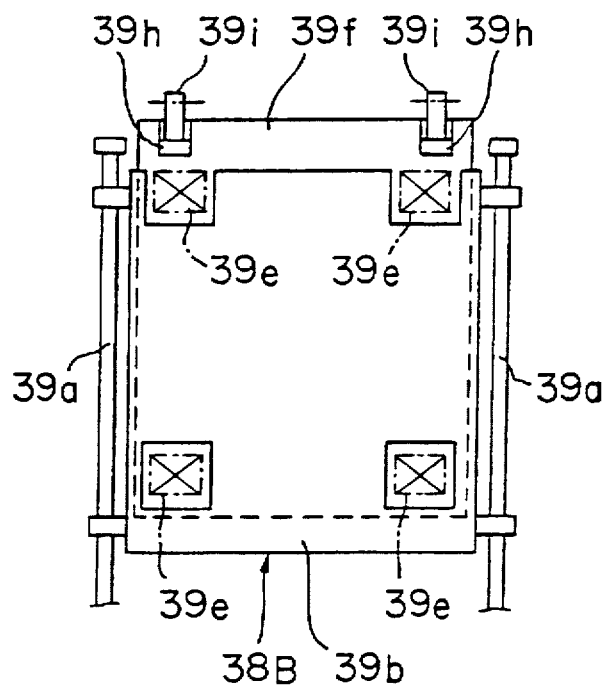
FIGS. 4A and 4B are a plan view (FIG. 4A) and cross-sectional view (FIG. 4B) of an opening/closing mechanism and door member of an aperture portion of the exchange chamber of the processing apparatus shown in FIG. 3.
Figure 4B:
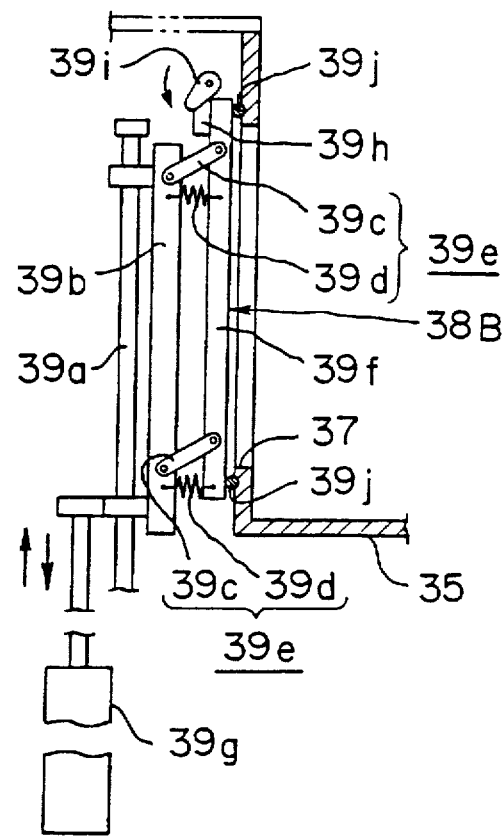

The mechanism for opening and closing each of the doors 38A and 38B and the mechanism for pulling each door tight (sealing mechanism) are the same, as shown in FIGS. 4A and 4B, so the description below concerns the mechanisms for the door 38B of the aperture 37, as representative of both doors. The door 38B is configured of a substantially rectangular door frame 39b that is attached in such a manner that it can slide along guide members 39a provided along two opposing sides of the aperture 37, and a rectangular main door member 39f that is attached in a separable manner to the door frame 39b by connection portions 39e provided in the vicinity of corners of the door frame 39b, each of these connection portions 39e comprising a link member 39c and a spring 39d. The opening/closing drive mechanism is configured in such a manner that the door frame 39b and the main door member 39f open or close the aperture 37 by the extending or contracting action of an air cylinder 39g for opening and closing the door, which is linked to the door frame 39b.

In a state in which the air cylinder 39g is extended so that the door frame 39b and main door member 39f close the aperture 37, tapered cam members 39h fixed at each side of the leading edge of the main door member 39f engage with rotational cams 39i provided on the edge of the aperture 37. The mechanism is configured in such a manner that the main door member 39f is pulled in toward the exchange chamber 35 against the elastic force of the springs 39d and comes into intimate contact with a seal member 39*j* that acts as a sealing member provided around the periphery of the aperture 37, so as to seal the aperture 37. When the air cylinder 39*g* is contracted, the engagement between the rotational cams 39*i* and the cam members 39*h* is released, the main door member 39*f* is moved away toward the door frame 39*b* side by the spring force of the springs 39*d*, away from the exchange chamber 35, and in this state the door frame 39*b* and the frame 39*b* and the main door member 39*f* move in the direction away from the aperture 37.

In this first embodiment of the invention, the seal member 39*j* is described above as being provided around the periphery of the aperture 37, but a sealing material could equally well be attached to the surface of the main door member 39*f* facing the periphery of the aperture. Similarly, the description above concerned a manner in which the main door member 39*f* of this first embodiment is pulled toward the exchange chamber 35 by a cam mechanism consisting of the cam members 39*h* and the rotational cams 39*i*. However, this mechanism need not necessarily be a pulling mechanism; it could equally well be such that, for example, the door frame 39*b* is attached so as to be able to move on the exchange chamber 35 side and, after the door frame 39*b* and the main door member 39*f* have moved to a position at which the aperture 37 is sealed, the door frame 39*b* is pulled inward by a pulling means such as a cylinder so that the main door member 39*f* comes into intimate contact with the exchange chamber 35. The means of moving the door 38B could be any kind of cylinder other than an air cylinder, or an opening/closing mechanism configured of cables such as pulleys and belts could be used.

The conveyor means 40 shown in FIGS. 1 and 2 is configured of a first conveyor mechanism 41 for transferring carriers 1 between the entrance/exit portion 10 and the exchange chamber 35 and between the exchange chamber 35 and the reaction furnace 20; a second conveyor mechanism 42 for conveying carriers 1 into and out of the storage portion, that is, the storage racks 30*a* and 30*b*; and a third conveyor mechanism 43 for transferring the carriers 1 between the first conveyor mechanism 41 and the second conveyor mechanism 42.

In this case, as shown in FIG. 2, the first conveyor mechanism 41 is configured of an elevator portion 41*a* formed of a ball screw and a multi-jointed arm 41*b* that extends and contracts to receive and transfer carriers 1 between the entrance/exit portion 10 and the exchange chamber 35 and between the exchange chamber 35 and the reaction furnace 20.

Figure 5:
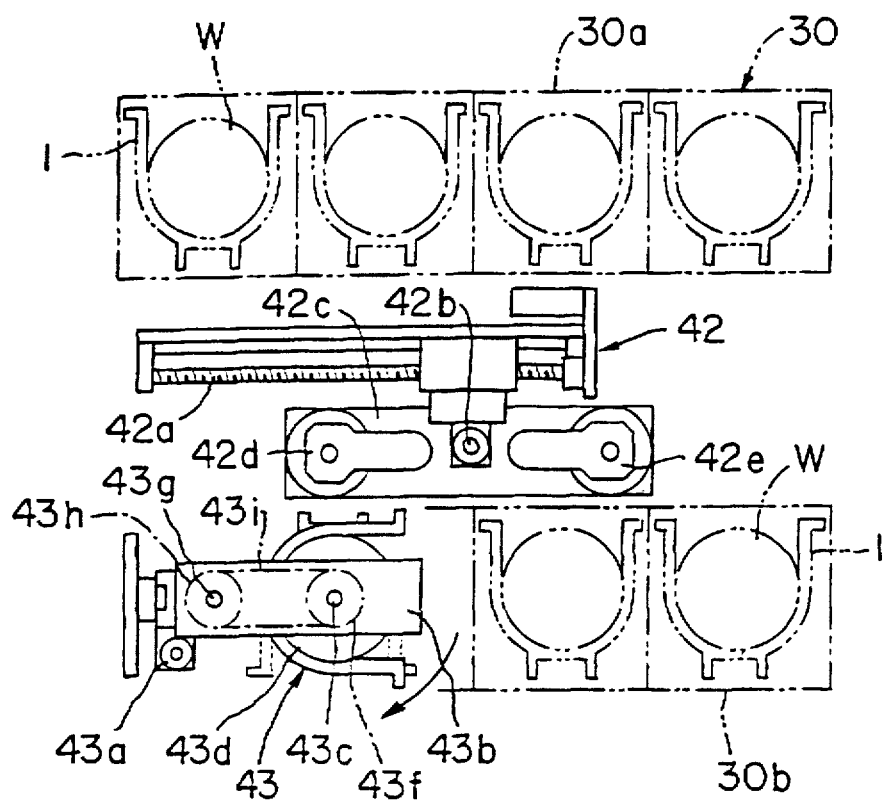
FIG. 5 is a plan view of the conveyor mechanism of the processing apparatus of FIG. 1.

The second conveyor mechanism 42, which is located between the storage racks 30*a* and 30*b*, is configured of a traveling portion 42*a* formed of a ball screw provided between the storage racks 30*a* and 30*b* which face each other within the sealed chamber 32, an elevator portion 42*b* formed of a ball screw standing erect from the traveling portion 42*a*, and two multi-jointed arms 42*d* and 42*e* mounted on either side of a holder member 42*c* attached horizontally to the elevator portion 42*b*, as shown in FIG. 5. This provision of two multi-jointed arms 42*d* and 42*e* in the second conveyor mechanism 42 makes it possible for the arms 42*d* and 42*e* to receive and transfer carriers 1 from each of the storage racks 30*a* and 30*b* that are arranged parallel and facing each other.

Figure 6A:
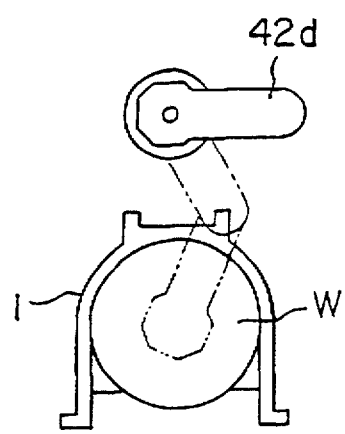
FIGS. 6A and 6B are schematic plan views illustrating conveying states of the conveyor mechanism.
Figure 6B:
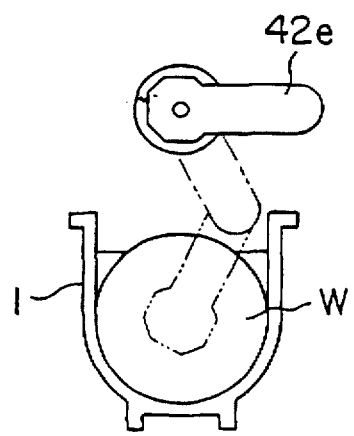

With this second conveyor mechanism 42, carriers 1 can be transferred by one of the arms 42*d* into and out of the storage rack 30*b* that has, for example, seven storage areas, while other carriers 1 are being transferred by the other of the arms 42*e* into and out of the storage rack 30*a* that has, for example, twelve storage areas, as shown in FIGS. 6A and 6B, so that the carriers 1 can be transferred smoothly.

The third conveyor mechanism 43 is configured of an elevator portion 43*a* formed of a ball screw provided within the sealed chamber 32, a rotary shaft 43*c* which descends from a lower surface of a holder arm 43*b* protruding horizontally from the elevator portion 43*a* and which is capable of swivelling, a carrier holder portion 43*d* attached to the rotary shaft 43*c* and capable of moving between the interior of the sealed chamber 32 and the interior of the exchange chamber 35, and a lid member 43*e* that closes the communicating port 36 between the sealed chamber 32 and the exchange chamber 35 when the carrier holder portion 43*d* is located within the exchange chamber 35, as shown in FIGS. 1 and 2.

In this case, the swivel mechanism is configured of a driven pulley 43*f* mounted on the rotary shaft 43*c*, a drive pulley 43*h* mounted on a drive shaft 43*g* of a drive motor (not shown) that can rotate in either direction, and a belt 43*i* strung between the driven pulley 43*f* and the drive pulley 43*h*, as shown in FIG. 3. The configuration is such that the rotation of the drive shaft 43*g* by the drive motor is transmitted from the drive pulley 43*h* via the belt 43*i* to rotate the driven pulley 43*f* and the rotary shaft 43*c*, so that the carrier holder portion 43*d* can rotate in either direction within a range of 90 degrees horizontally.

The above described configuration of the third conveyor mechanism 43 makes it possible for a carrier 1 that has been conveyed by the arm 41*b* of the first conveyor mechanism 41 to be received by the carrier holder portion 43*d* within the exchange chamber 35, in a state in which the elevator portion 43*a* is lowered so that the carrier holder portion 43*d* is located within the exchange chamber 35, and the communicating port 36 is closed by the lid member 43*e*. Therefore, after the arm 41*b* of the first conveyor mechanism 41 has retreated from the interior of the exchange chamber 35 and the aperture 37 has been closed by the door 38B, the elevator portion 43*a* of the third conveyor mechanism 43 rises until the carrier holder portion 43*d* has been moved to a predetermined position within the sealed chamber 32, whereupon the swivel mechanism operates to cause the carrier holder portion 43*d* and the carrier 1 to rotate through 90 degrees to be received by the arm 42*d* or 42*e* of the second conveyor mechanism 42. After a carrier 1 taken from within the storage rack 30*a* or 30*b* by the arm 42*d* or 42*e* of the second conveyor mechanism 42 has been received by the carrier holder portion 43*d* of the third conveyor mechanism 43, and after the swivel mechanism has operated in the opposite manner to that described above to rotate the carrier holder portion 43*d* and the carrier 1 through 90 degrees, the elevator portion lowers to convey the carrier holder portion 43*d* and the carrier 1 into the exchange chamber 35, and the carrier 1 is conveyed by the arm 41*b* of the first conveyor mechanism 41, which enters the exchange chamber 35 from the aperture 37 of the exchange chamber 35, to a different location such as the reaction furnace 20 or the entrance/exit portion 10.

The reaction furnace 20 is configured of a downward-opening cylindrical process tube of a material such as quartz glass, with a heater provided around the periphery thereof, as shown in FIG. 1. The configuration is such that the wafer boat 22, which is provided below the reaction furnace 20, can be raised and lowered by an elevator mechanism (not shown) so that it is moved into and out of the reaction furnace 20. A carrier stage 24 is provided beside the reaction furnace 20, with the configuration being such that wafers W within a carrier 1 that has been conveyed onto this carrier stage 24 are received by a conveyor arm 26 and are conveyed into the wafer boat 22 thereby, or wafers W held within the wafer boat 22 are taken by the conveyor arm 26 and are conveyed into a carrier on the carrier stage 24. The spaces within components such as the wafer boat 22 and the carrier stage 24 (the loading area) are maintained as a clean environment.

The operation of the processing apparatus of this first embodiment of the present invention will now be described.

Figure 7:
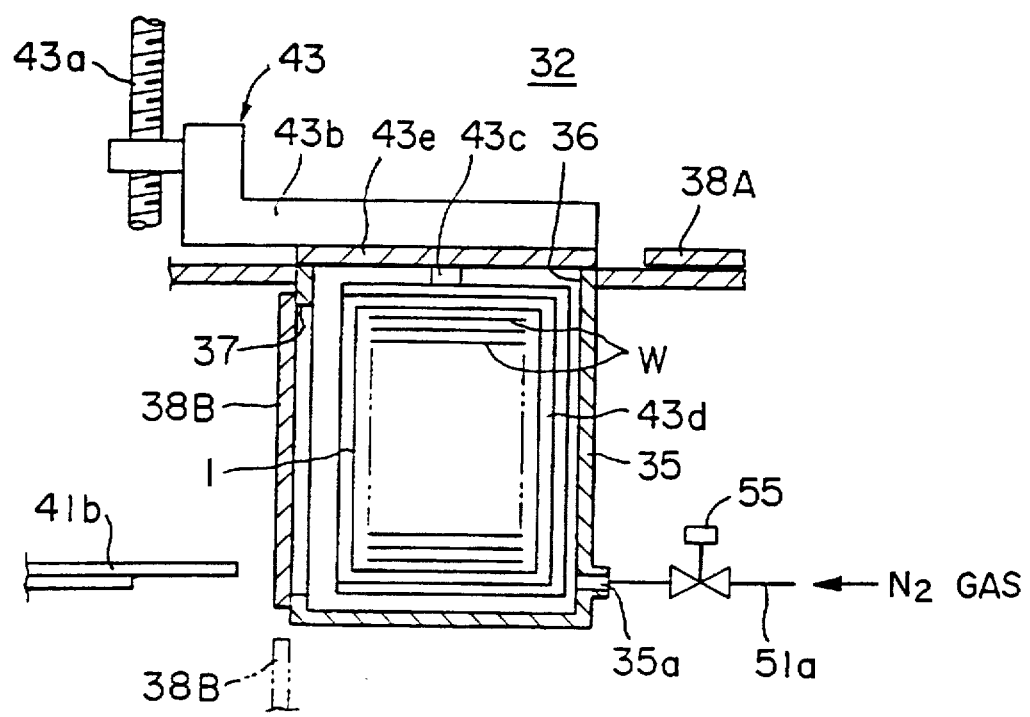
FIG. 7 is a cross-sectional view showing a state in which the exchange chamber of FIG. 3 is isolated from the outer atmosphere.

First of all, after a carrier 1 containing wafers W in a vertical orientation has been conveyed into the entrance/exit portion 10, the carrier 1 is rotated through 90 degrees in the vertical direction by the carrier reorientation mechanism 12 of the entrance/exit portion 10 to an orientation in which the wafers W therein are horizontal, as shown in FIG. 2. In this orientation, the carrier 1 is received by the arm 41b of the first conveyor mechanism 41 and is conveyed into the exchange chamber 35, then the carrier 1 is transferred to the carrier holder portion 43d of the third conveyor mechanism 43 which is positioned within the exchange chamber 35. After the carrier 1 has been transferred to the carrier holder portion 43d, the arm 41b of the first conveyor mechanism 41 retreats from the exchange chamber 35 and the aperture 37 is closed by the door 38B. Thus the interior of the exchange chamber 35 is isolated from the outer atmosphere and also from the sealed chamber 32 by the lid member 43e that closes the communicating port 36 (see FIG. 7). In this state, nitrogen is supplied from the nitrogen supply source 50 into the exchange chamber 35, so that the wafers accommodated in the carrier 1 within the exchange chamber 35 are immersed in an inert gas environment.

Figure 8:
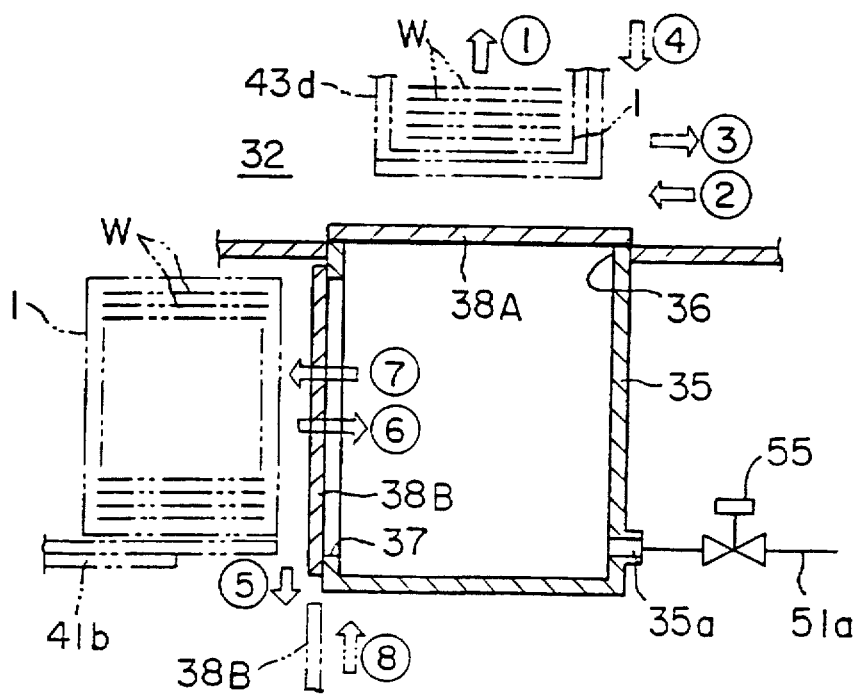
FIG. 8 is a cross-sectional view illustrating the processes of conveying a carrier into and out of the exchange chamber of FIG. 3.

The elevator portion 43a of the third conveyor mechanism 43 is then raised so that the carrier holder portion 43d is moved from the interior of the exchange chamber 35 into the sealed chamber 32 (step ① in FIG. 8). After the carrier holder portion 43d has reached a position at a predetermined height, the swivel mechanism operates to rotate it through 90 degrees horizontally to change the orientation of the carrier holder portion 43d and the carrier 1. In this state, the carrier 1 is received by the arm 42d or 42e of the second conveyor mechanism 42 and the carrier 1 is conveyed thereby into an appropriate storage area in the storage rack 30a or 30b.

After the elevator portion 42b of the second conveyor mechanism 42 has risen so that the carrier holder portion 43d is pulled upward from the exchange chamber 35, the door 38A closes the communicating port 36 (step ② FIG. 8) so that the sealed chamber 32 and the exchange chamber 35 are isolated from one another. Thus the interior of the sealed chamber 32 is isolated from the outer atmosphere. In this state, nitrogen is supplied from the nitrogen supply source 50 into the sealed chamber 32 to maintain the nitrogen environment in the interior of the sealed chamber 32. If the oxygen concentration within the sealed chamber 32 exceeds a predetermined value during this time, the controller 60 receives a detection signal from the oxygen concentration detection sensor 61 and sends control signals to the switching control valves 53 and 54 to control the degree of opening of the valves 53 and 54 so that nitrogen at an appropriate pressure and flowrate is supplied to the interior of the sealed chamber 32 and thus the inert gas environment in the interior of the sealed chamber 32 is always maintained at a suitable state. This ensures that unprocessed wafers W within the carriers 1 conveyed into the storage racks 30a and 30b are maintained in this inert gas environment while a predetermined number of other carriers 1 containing other wafers W is conveyed into the storage racks 30a and 30b, and while other wafers W are being subjected to thermal processing.

Therefore, wafers W can be conveyed from the storage portion 30 into the reaction furnace 20 or the entrance/exit portion 10 in a state in which no natural oxide films are formed thereon.

After one of the above described carriers 1 containing unprocessed wafers W, which are stored in the storage portion within the sealed chamber 32, has been taken from the storage chamber by the arm 42d or 42e of the second conveyor mechanism 42 in a sequence opposite to that described above, and has been transferred to the carrier holder portion 43d of the third conveyor mechanism 43, the door 38A opens the communicating port 36 (step ③ in FIG. 8) and the elevator portion 43a of the third conveyor mechanism 43 lowers to move the carrier 1 together with the carrier holder portion 43d into the exchange chamber 35 (step ④ in FIG. 8).

When the carrier holder portion 43d is moved into the exchange chamber 35, the communicating port 36 is closed by the lid member 43e and the interior of the exchange chamber 35 is filled with a nitrogen environment. The door 38B then opens the aperture 37 (step ⑤ in FIG. 8) and the carrier holder portion 43d is received by the arm 41b of the first conveyor mechanism 41 which enters the exchange chamber 35 through the aperture 37 (steps ⑥ and ⑦ in FIG. 8). After the carrier holder portion 43d has been conveyed out of the exchange chamber 35, the door 38B closes the aperture 37 (step ⑧ in FIG. 8). The carrier holder portion 43d removed in this manner from the exchange chamber 35 is conveyed to the carrier stage 24 beside the reaction furnace 20. The wafers W within this carrier 1 that has been conveyed to the carrier stage 24 are conveyed into the wafer boat 22 by the conveyor arm 26 until a predetermined number of wafers W, such as 100, has been set in the wafer boat 22, whereupon the wafer boat 22 rises to convey the wafers W into the reaction furnace 20 where they are subjected to the predetermined thermal processing.

After this thermal processing, the wafer boat 22 lowers and the wafers W removed thereby from the reaction furnace 20 are stored by the conveyor arm 26 into an empty carrier 1 on the carrier stage 24. In a sequence opposite to that described above, the arm 41b of the first conveyor mechanism 41 receives the carrier 1 and transfers it to the carrier holder portion 43d within the exchange chamber 35. The carrier 1 held by the carrier holder portion 43d is received by the arms 42d or 42e of the second conveyor mechanism 42 and is conveyed thereby to a predetermined storage area within the storage rack 30a or 30b, where they are maintained in an inert gas environment, isolated from the outer atmosphere, until the other wafers W have been processed.

As described above, each of the carriers accommodating the processed wafers W in the storage racks 30a and 30b is removed by the arm 42d or 42e of the second conveyor mechanism 42, is transferred to the carrier holder portion 43d, and is conveyed thereby into the exchange chamber 35. It is then removed by the arm 41b of the first conveyor mechanism 41 and is transferred to the carrier reorientation mechanism 12 of the entrance/exit portion 10. The wafers W accommodated in the carrier 1 in a horizontal orientation are returned to a vertical orientation by a rotation of the carrier reorientation mechanism 12 through 90 degrees, and the carrier 1 is conveyed to a predetermined location.

Thus, not only are the carriers 1 containing unprocessed wafers W and the carriers 1 containing processed wafers stored in the sealed chamber 32 isolated from the outer atmosphere, but contamination of the wafers W by organic substances and heavy metals can be prevented by maintaining an inert gas environment within the sealed chamber 32.

When carriers 1 are being conveyed into and out of the storage portion 30, each carrier 1 is stored temporarily in the exchange chamber 35 and an inert gas environment is formed in the exchange chamber 35. This means that the wafers W are in contact with the outer atmosphere for the shortest possible time, and thus contamination of the wafers W by organic substances and heavy metals can be prevented.

Second Embodiment

Figure 9:
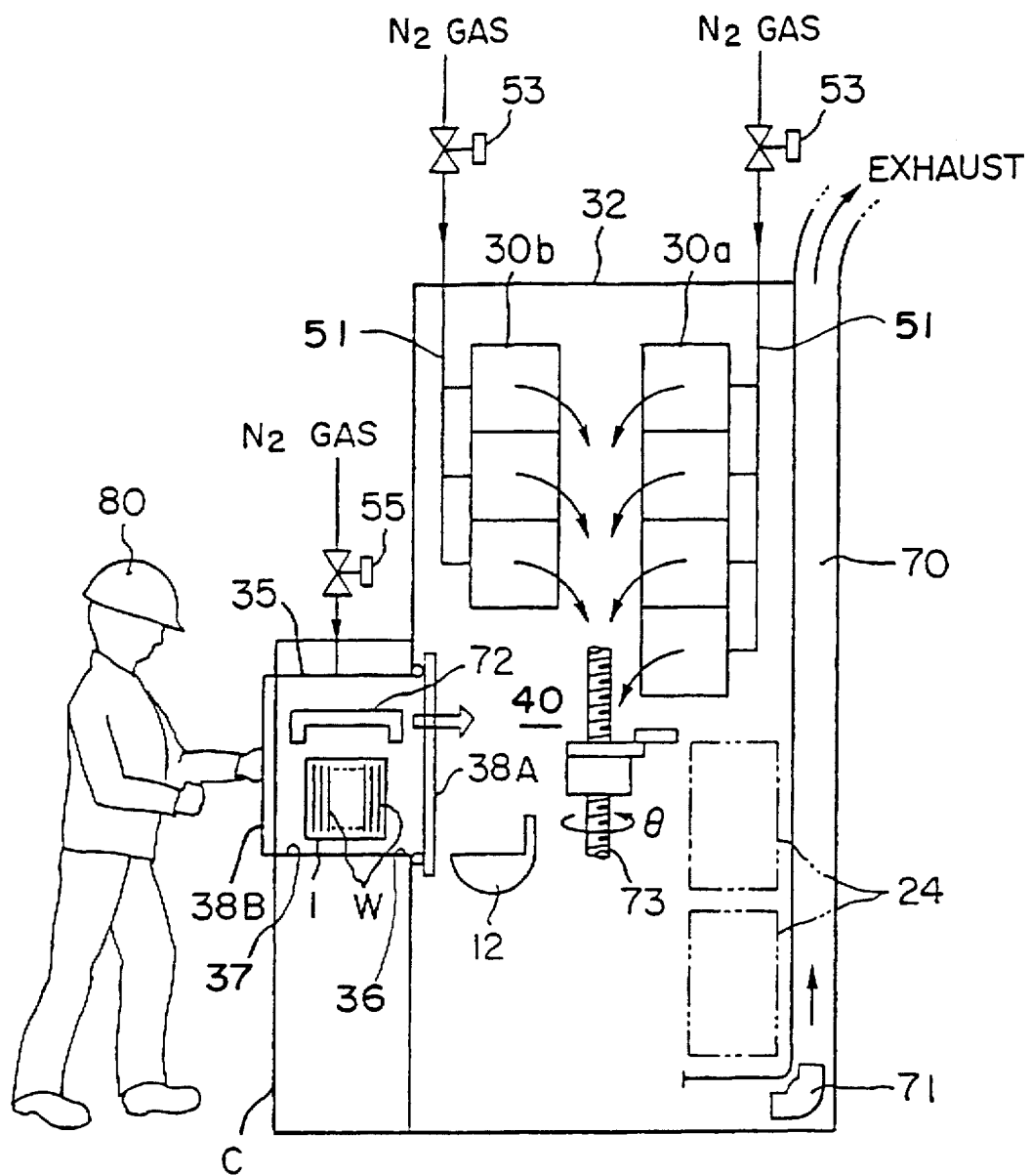
FIG. 9 is a schematic cross-sectional view of a second embodiment of the processing apparatus of the present invention.

A schematic cross-sectional view of a second embodiment of the processing apparatus in accordance with this invention is shown in FIG. 9.

This second embodiment is characterized in that the entire carrier storage portion and the conveyor means are provided within the sealed chamber 32, isolated from the outer atmosphere. In other words, the configuration is such that storage racks 30a and 30b and a conveyor means 40 are disposed within a sealed chamber 32, access thereto is from an exchange chamber 35 through a communicating port 36 provided beside the sealed chamber 32, a door 38A is provided in an openable manner in the communicating port 36, and a door 38B is provided in an openable manner in an aperture 37 for conveying the carriers in and out of the exchange chamber 35.

In this case, a nitrogen supply pipe 51 is provided for each of the storage areas in the storage racks 30a and 30b, and an exhaust duct 70 is provided in a lower portion of the sealed chamber 32 for exhausting the atmosphere within the sealed chamber 32 out through an exhaust port 34. The provision of a suction fan 71 in the exhaust duct 70 ensures that nitrogen can be actively supplied to the comparatively large-volume sealed chamber 32, and oxygen and water vapor within the sealed chamber 32 can be exhausted therefrom. Note that a carrier stage 24 could also be provided within the sealed chamber 32, as shown by broken lines in FIG. 9. In such a case, an openable door (not shown) could be provided between the sealed chamber 32 and a reaction furnace 20, and thus wafers W can be transferred to and from a carrier 1 on the carrier stage 24 and a wafer boat (not shown).

The conveyor means 40 of this second embodiment is configured of a conveyor mechanism 72 for conveying carriers 1 into and out of the exchange chamber 35 and the sealed chamber 32, and a conveyor mechanism 73 for transferring carriers 1 between the storage racks 30a and 30b and which is capable of moving horizontally and vertically and rotating through an angle θ. Carriers 1 that have been conveyed into the exchange chamber 35 and carriers 1 that are to be conveyed from the sealed chamber 32 into the exchange chamber 35 are configured in such a manner that they can be rotated through 90 degrees to the vertical direction by the carrier reorientation mechanism 12. Note that all other components of this second embodiment are the same as those of the first embodiment, so further description thereof is omitted.

With the processing apparatus configured as described above, a carrier 1 containing unprocessed wafers W, which has been conveyed into the exchange chamber 35 by an operator 80 or an automatic conveyor apparatus (not shown), is shut in by the door 38B of the aperture 37 of the exchange chamber 35. The interior of the exchange chamber 35 is then filled with a nitrogen environment, so that the wafers W are always enclosed within this nitrogen environment, even when they are stored in the storage racks 30a and 30b within the sealed chamber 32. Therefore, the time during which the wafers W are exposed to the outer atmosphere can be minimized, ensuring that the wafers W can be prevented even further from becoming contaminated by organic substances and heavy metals.

Third Embodiment

Figure 10:
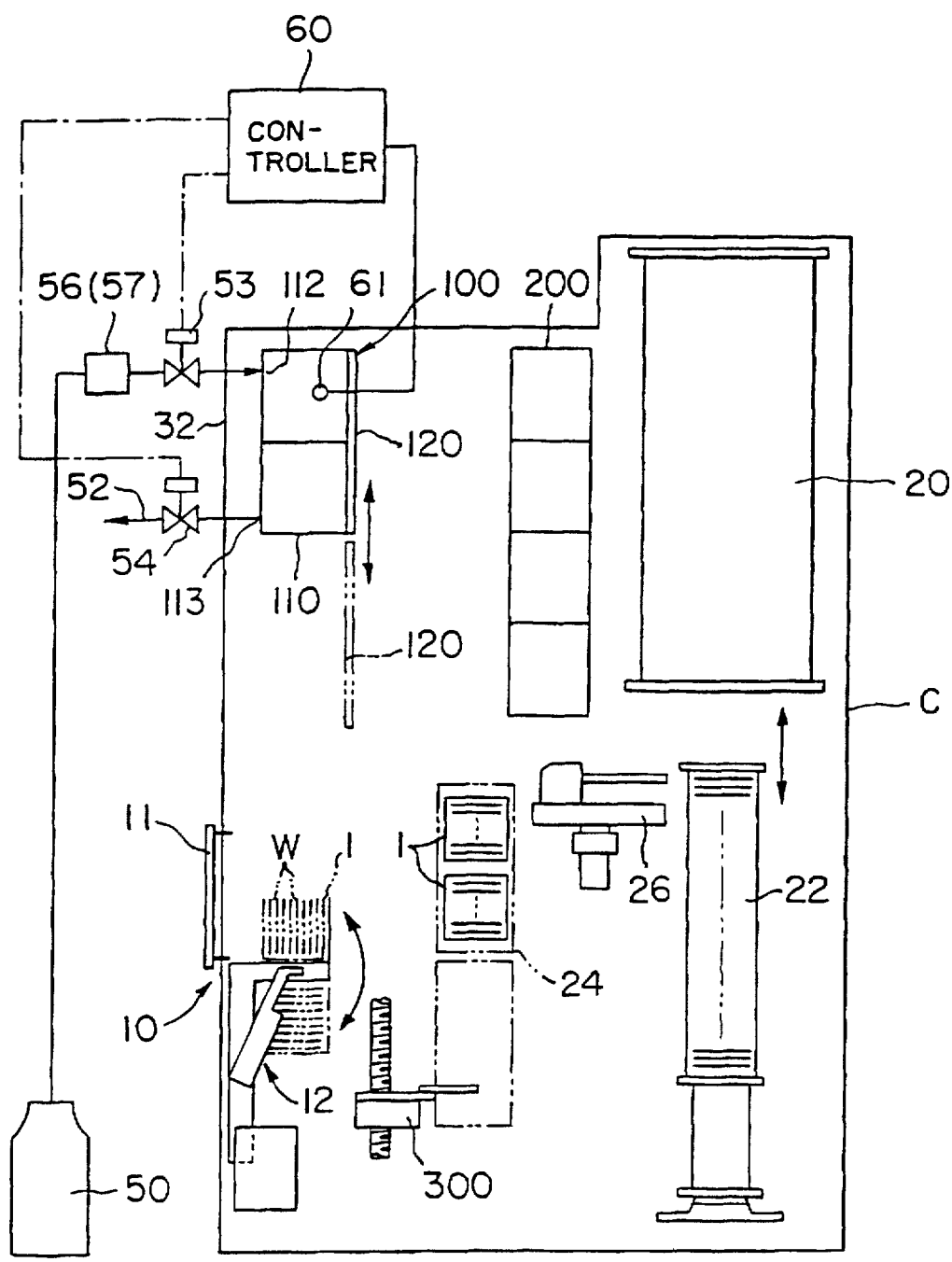
FIG. 10 is a schematic cross-sectional view of a third embodiment of the processing apparatus of the present invention.

A schematic cross-sectional view of a third embodiment of the processing apparatus in accordance with this invention is shown in FIG. 10.

This third embodiment is used when it is intended to minimize the amount of inert gas used and also reduce the time taken to process the wafers W. In other words, at least a storage portion in which carriers 1 containing unprocessed wafers W are stored is made to have an inert gas environment, so that the unprocessed wafers W are prevented from being contaminated by organic substances and heavy metals, and the processing of the wafers W can be speeded up.

The processing apparatus of this third embodiment is configured of a entrance/exit portion 10 which is provided with an automatic door 11 and a carrier reorientation mechanism 12, a first storage chamber 100 for storing at least carriers 1 containing unprocessed wafers W, and a second storage chamber 200 for storing other carriers 1 (such as empty carriers, carriers containing unprocessed or processed wafers, carriers containing dummy wafers that are used for monitoring the process, and carriers filled with completed products). In addition, a carrier conveyor mechanism 300 that is capable of moving a wafer grasping portion that conveys the carriers 1 either horizontally or vertically, or rotating the same, is provided between a reaction furnace 20 and the entrance/exit portion 10, the first storage chamber 100, or the second storage chamber 200, or between the first storage chamber 100 or second storage chamber 200 and the carrier stage 24 that acts as a transfer area for the reaction furnace 20. Similarly, a conveyor arm 26 for conveying the wafers is provided between the reaction furnace 20 and the carrier stage 24.

Figure 11:
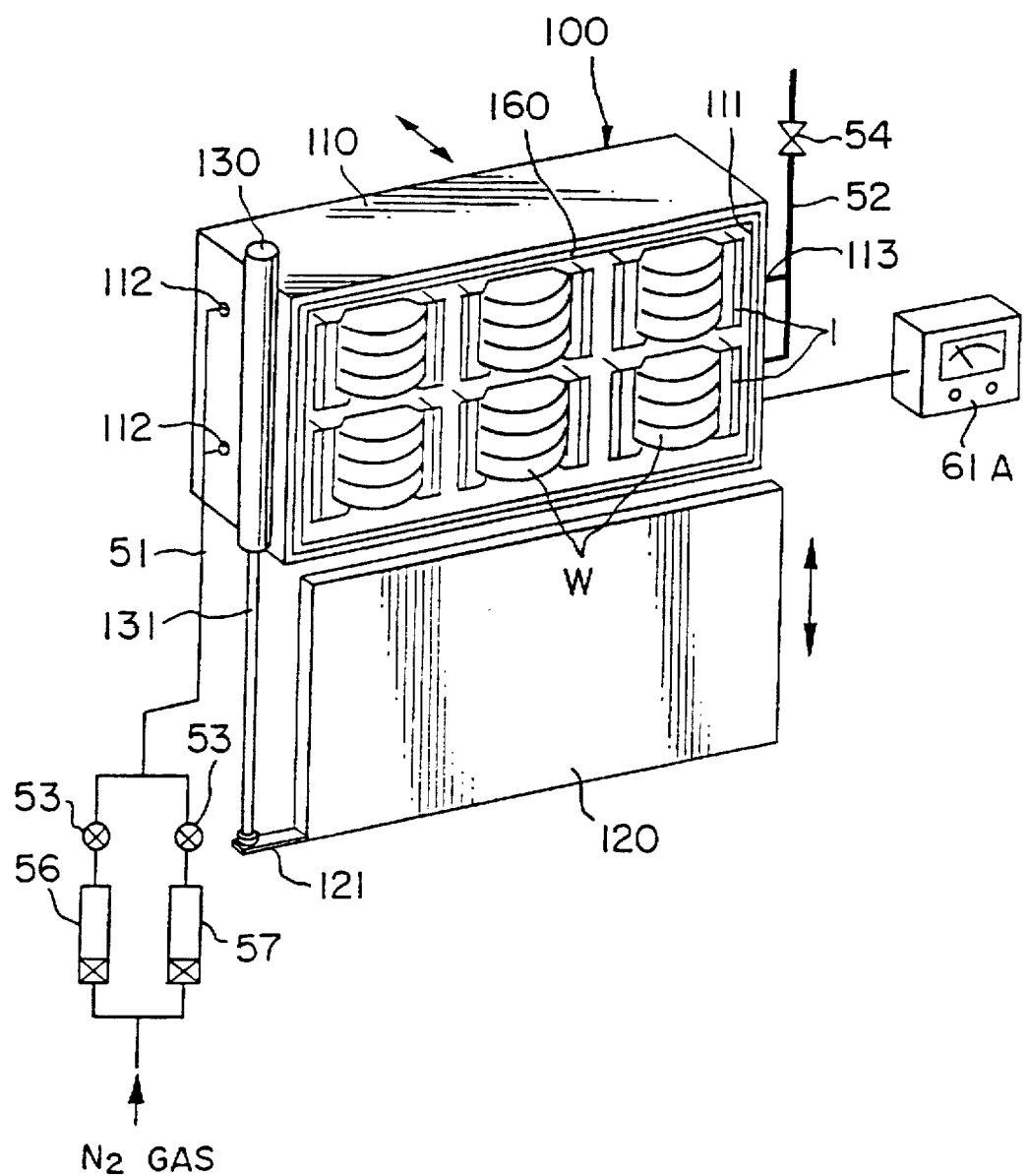
FIG. 11 is a perspective view of the first storage chamber of FIG. 10.

The first storage chamber 100 mentioned above is configured of a box-shaped main unit 110 having shelving space for storing a number of carriers 1, such as six carriers, and a door member 120 that can open and close an aperture portion 111 for conveying carriers into and out of the first storage chamber 100, which is provided in a side surface of the main unit 110, as shown in FIG. 11. In this case, the door member 120 is disposed in a manner such that it is free to move vertically along guides (not shown), a bracket 121 protruding from a lower edge of one side of the door member 120 is linked to a piston rod 131 of an air cylinder 130, and the configuration is such that the opening and closing of the door member 120 is obtained by driving the air cylinder 130 to contract or extend.

The box-shaped main unit 110 is arranged to be free to slide along guide rails 140 provided perpendicular to the door member 120, with the configuration being such that the main unit 110 can be moved towards and away from the door member 120 by the extension and contraction of an air cylinder 150, as shown in FIG. 12A. A seal member 160 is provided around the periphery of the aperture portion 111 of the thus configured box-shaped main unit 110, in such a manner that the operation of the air cylinder 150 moves the box-shaped main unit 110 into a state in contact with the door member 120, which is at an upper position thereof, so that the first storage chamber 100 is isolated from the outer atmosphere and is thus sealed. A limit switch 170 is provided in the aperture portion 111 of the box-shaped main unit 110, with the configuration being such that the limit switch 170 operates in a state in which the box-shaped main unit 110 and the door member 120 have come into intimate contact, and a signal therefrom is sent to a controller 60 which will be described in detail later.

It should be noted that, although the above description of this third embodiment stated that the opening and closing of the door member 120 and the forward and backward movement of the box-shaped main unit 110 is caused by the operation of air cylinders 130 and 150, the drive means need not necessarily be air cylinders; other drive means such as ball screws could be used instead. In addition, the box-shaped main unit 110 of this third embodiment was described above as moving forward and backward with respect to the door member 120 to seal the first storage chamber 100, but the configuration could be such that the box-shaped main unit 110 is fixed and the door member 120 is moved forward and backward with respect to the aperture portion 111 of the box-shaped main unit 110. In such a case, the forward and backward movement of the door member 120 could be implemented by a pulling mechanism similar to that of the first embodiment described above and shown in FIG. 4. Furthermore, the above description of the third embodiment concerned a seal member 160 and limit switch 170 attached to the aperture portion 111 of the box-shaped main unit 110, but the seal member 160 and limit switch 170 could equally well be attached to the door member 120 side instead of the first storage chamber 100 side.

In a similar manner to that of the above described sealed chamber 32 and exchange chamber 35 of the first embodiment, apertures such as a nitrogen supply port 112 and an exhaust port 113 are provided in the box-shaped main unit 110 of the first storage chamber 100, a nitrogen supply source 50 is connected to the nitrogen supply port 112 by a supply pipe 51, and an exhaust pipe 52 is connected to the exhaust port 113. Switching control valves 53 and 54 are provided partway along the nitrogen supply pipe 51 and the exhaust pipe 52, respectively, as means of opening and closing these pipelines. In addition, a first flowrate control valve 56 to pass and a serge volume of gas to pass and a second flowrate control valve 57 that allows a small volume of gas to pass are provided in parallel partway along the nitrogen supply pipe 51. The configuration is such that the switching control valves 53 and 54 and the flowrate control valves 56 and 57 are controlled by control signals from the controller 60.

In this case, the controller 60 is configured to receive a detection signal from an oxygen concentration detection sensor 61 (concentration detection means) that is provided within the first storage chamber 100 to detect the concentration of oxygen therein, compare that signal with previously stored information, and send appropriate control signals to the switching control valves 53 and 54 and the flowrate control valves 56 and 57. Note that, in this case, the first and second flowrate control valves 56 and 57 could be integrated to form a single control valve. Note also that reference number 61A in FIG. 11 denotes an oxygen concentration detection meter.

With the above described configuration, a carrier 1 containing unprocessed wafers W is conveyed into the box-shaped main unit 110, then the door member 120 rises and the box-shaped main unit 110 comes into intimate contact with the door member 120 to seal the interior of the first storage chamber 100. The resultant operation of the limit switch 170 causes a control signal to be sent from the controller 60 to the flowrate control valves 56 and 57 so that first the first flowrate control valve 56 operates to supply a large volume of nitrogen into the first storage chamber 100, then, after a certain quantity of nitrogen has filled the interior of the first storage chamber 100, the first flowrate control valve 56 closes and simultaneously the second flowrate control valve 57 operates to supply a small volume of nitrogen into the first storage chamber 100. Thus the interior of the first storage chamber 100 is filled with a suitable nitrogen environment within a short period of time, then a small quantity of nitrogen is supplied to maintain this suitable nitrogen environment. If the oxygen concentration within the first storage chamber 100 exceeds a predetermined value, the controller 60 receives a detection signal from the oxygen concentration detection sensor 61 and sends control signals to the switching control valves 53 and 54 and the flowrate control valves 56 and 57 to control these valves 53, 54, 56, and 57 so that nitrogen at an appropriate pressure and flowrate is supplied to the interior of the sealed chamber 32. This ensures that any oxygen and water vapor within the first storage chamber 100 are swept up by the supplied nitrogen and exhausted through the exhaust pipe 52. When the oxygen concentration in the first storage chamber 100 falls below the predetermined value as a result of this process, the switching control valves 53 and 54 are closed by control signals from the controller 60 and thus the supply of nitrogen stops.

Since the carrier storage portions within the first storage chamber 100 are purged with an inert gas until the oxygen concentration falls below a predetermined value, as described above, unwanted gases such as oxygen and water vapor are exhausted therefrom and thus oxides and other unwanted substances can be prevented from forming on the wafers W contained in the carrier 1. Therefore the wafers W are transferred into other parts of the apparatus, such as the reaction furnace 20, in a state in which they are free of natural oxide films.

Note that the second storage chamber 200 is configured to accommodate 12 carriers 1, for example. The carrier conveyor mechanism 300 could be configured of a conveyor robot provided with means such as ball screws and multi-jointed arms.

Different operating states of the above third embodiment will now be described with reference to FIGS. 13 and 14.
Operating State 1

Figure 13:
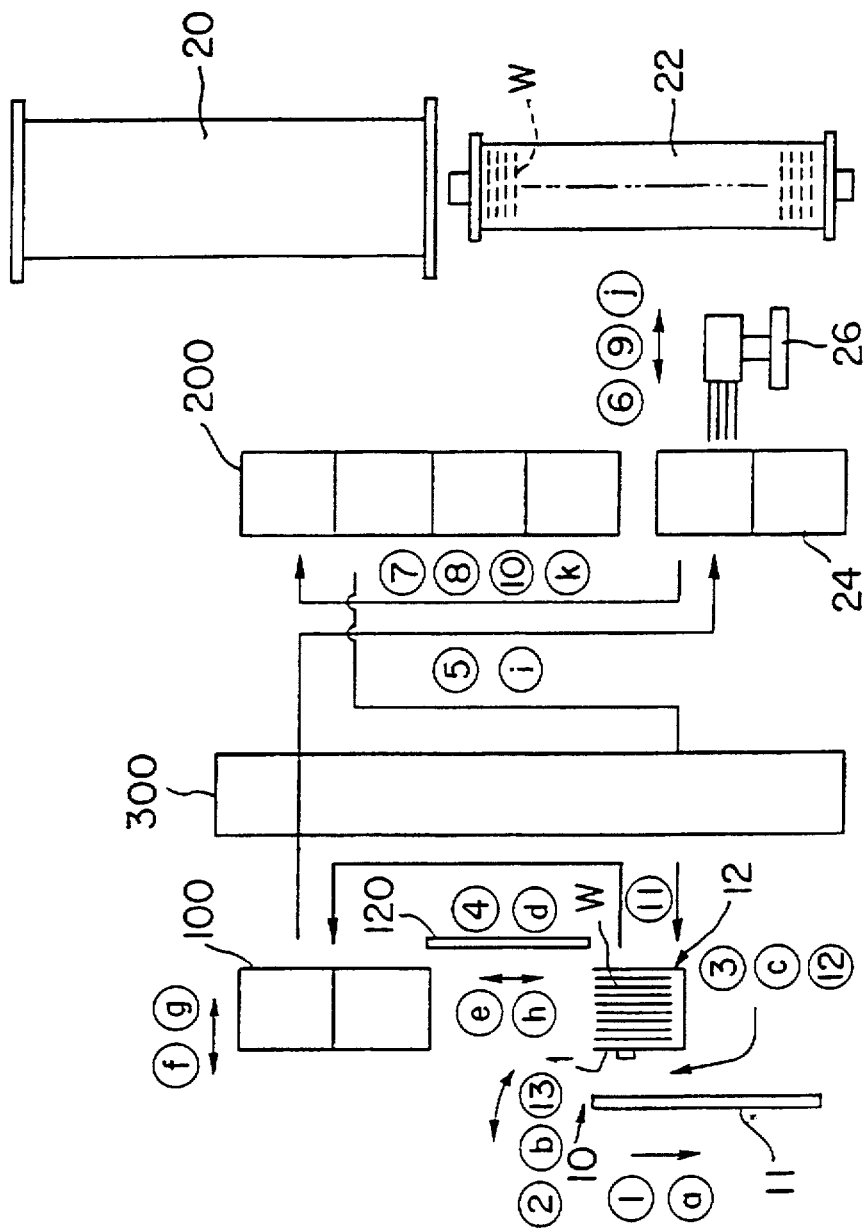
FIG. 13 is a view illustrating an operating state of the processing apparatus of the third embodiment of the present invention.

First of all, the automatic door 11 opens and a carrier 1 of a first batch is conveyed into the entrance/exit portion 10, as shown in FIG. 13. The orientation of the carrier 1 is then rotated through 90 degrees by the carrier reorientation mechanism 12, and that carrier 1 is received by the carrier conveyor mechanism 300 and is conveyed into the first storage chamber 100 (steps ① to ④ in FIG. 13). If, for example, six carriers 1 are to be stored, this sequence of operations is repeated six times until the first batch of wafers W have been accepted.

Each of the carriers 1 is conveyed by the carrier conveyor mechanism 300 from the first storage chamber 100 to the carrier stage 24. The unprocessed wafers W contained within each carrier 1 conveyed to the carrier stage 24 are conveyed into the wafer boat 22 by the conveyor arm 26. The empty carriers 1 that were used to convey the wafers W are conveyed to the second storage chamber 200 by the carrier conveyor mechanism 300.

In this manner, the wafers W contained within six carriers are conveyed to the wafer boat 22 to complete the charging of the first batch (steps ⑤ to ⑦ in FIG. 13). The wafer boat 22 containing the predetermined number of wafers W rises and is inserted into the reaction furnace 20, where the predetermined processing is performed.

While the first batch of wafers W are being processed, wafers W for the second batch are inserted into the entrance/exit portion 10 in the same manner as the first batch, are rotated through 90 degrees by the carrier reorientation mechanism 12, and are then conveyed into the first storage chamber 100 by the carrier conveyor mechanism 300 (steps ⓐ to ⓓ in FIG. 13). This sequence of operations is repeated six times to complete the acceptance of the second batch.

After the six carriers 1 for the second batch have been stored in the first storage chamber 100, the door member 120 is closed and also the box-shaped main unit 110 is brought into intimate contact with the door member 120 to seal the interior of the first storage chamber 100. Then, as described above, nitrogen is supplied from the nitrogen supply source 50 into the first storage chamber 100 so that the unprocessed wafers W contained within the carriers 1 stored in the first storage chamber 100 are immersed in a nitrogen environment of a predetermined concentration (steps (e) and (f) of FIG. 13).

After the predetermined processing has been performed on the wafers in the reaction furnace 20, one of the empty carriers 1 in the second storage chamber 200 is conveyed to the carrier stage 24 by the carrier conveyor mechanism 300, and the processed wafers W within the wafer boat 22 are conveyed into this carrier 1 by the conveyor arm 26. The carrier 1 containing these wafers W is conveyed to the second storage chamber 200 by the carrier conveyor mechanism 300 (steps (8) to (10) in FIG. 13). This sequence of operations is repeated six times until the processing and conveying of the first batch of wafers W is complete.

Each of the carriers 1 containing the processed wafers W in the second storage chamber 200 is conveyed to the entrance/exit portion 10 by the carrier conveyor mechanism 300, is rotated through 90 degrees by the carrier reorientation mechanism 12, then is conveyed out of the apparatus (steps (11) to (13) in FIG. 13). This sequence of operations is repeated six times until the first batch of wafers W have been removed.

Meanwhile, after the second batch of wafers W stored in the first storage chamber 100 have been immersed in the nitrogen environment for a predetermined time, the box-shaped main unit 110 moves backwards and the door member 120 simultaneously lowers to open the first storage chamber 100. A carrier 1 within the first storage chamber 100 is then conveyed by the carrier conveyor mechanism 300 onto the carrier stage 24 and the unprocessed wafers W contained within this carrier 1 that has been conveyed to the carrier stage 24 are then conveyed to the wafer boat 22 by the conveyor arm 26. The empty carrier 1 from which the wafers W have been removed is conveyed to the second storagechamber 200 by the carrier conveyor mechanism 300.

In this manner, the wafers W contained within six carriers are conveyed to the wafer boat 22 to complete the charging of the second batch (steps (g) to (k) in FIG. 13). The wafer boat 22 containing the predetermined number of wafers W of the second batch rises and is inserted into the reaction furnace 20, where the predetermined processing is performed. After the thus processed wafers W have been conveyed to the second storage chamber 200 in the same manner as described above, they are conveyed to the entrance/exit portion 10 and removed from the apparatus.

Subsequently, after the third and subsequent batches of wafers W are inserted into the first storage chamber 100 and immersed in a nitrogen environment therein in the same manner, they are conveyed to the reaction furnace 20 for processing.

As described above, the unprocessed wafers W that are waiting for processing are stored in the first storage chamber 100 and are immersed in a nitrogen environment therein. This ensures that the wafers W can be protected from the effects of organic substances and heavy metals and thus deterioration in the yield of completed products due to contamination of the wafers W can be prevented. Moreover, the amount of nitrogen used can be reduced to a minimum by placing only unprocessed wafers W in this nitrogen environment, enabling a reduction in the energy required for supplying the nitrogen. The wafers can also be conveyed more rapidly by storing the empty carriers 1 for the wafers W that are currently being processed and the carriers 1 containing processed wafers W in the second storage chamber 200.

Operating State 2

Figure 14:
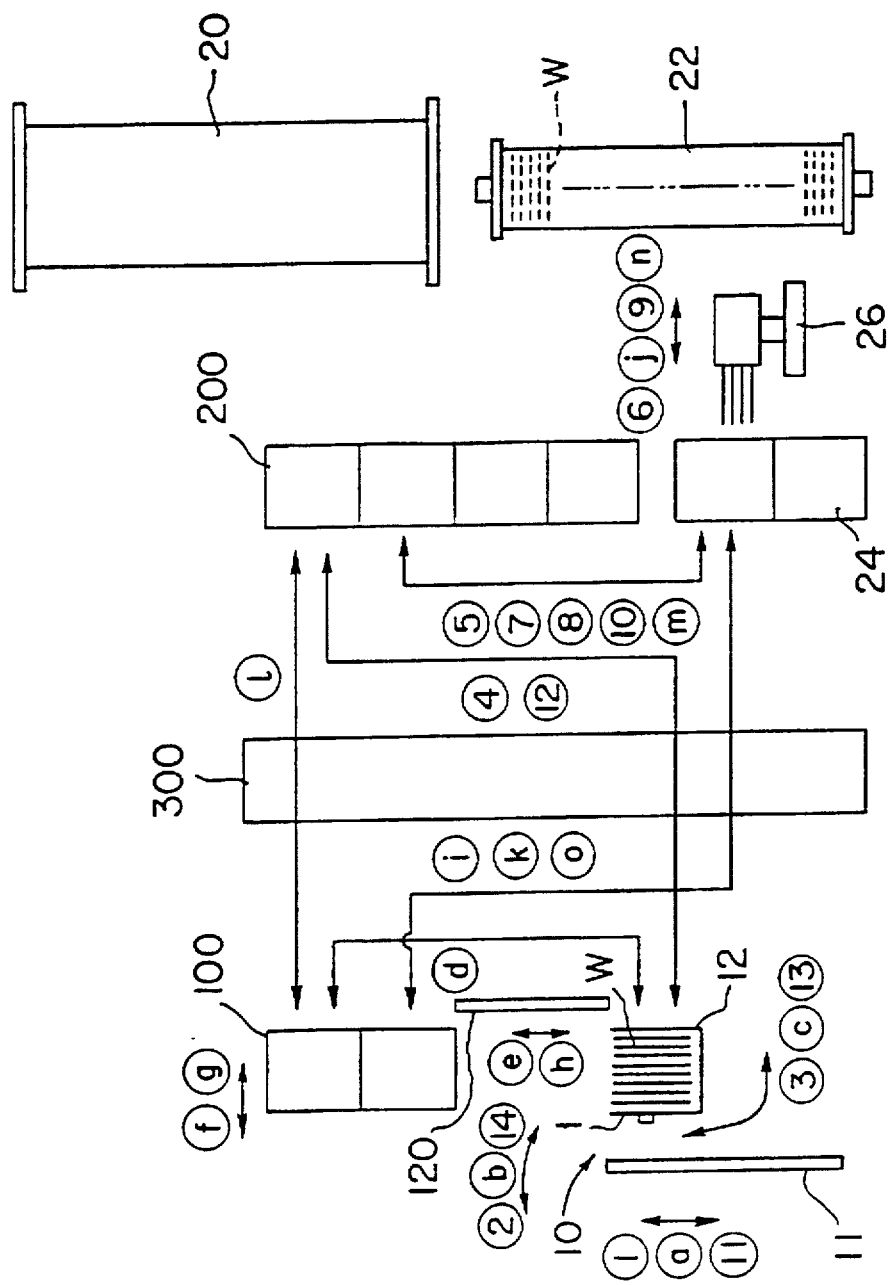
FIG. 14 is a view illustrating another operating state of the processing apparatus of the third embodiment of the present invention.

First of all, the automatic door 11 opens and a carrier 1 of a first batch is conveyed into the entrance/exit portion 10, as shown in FIG. 14. The orientation of the carrier 1 is then rotated through 90 degrees by the carrier reorientation mechanism 12, and that carrier 1 is received by the carrier conveyor mechanism 300 and is conveyed into the second storage chamber 200 (steps (1) to (4) in FIG. 14). If, for example, six carriers 1 are to be stored, this sequence of operations is repeated six times until the first batch of wafers W have been accepted.

Each of the carriers 1 is conveyed by the carrier conveyor mechanism 300 from the second storage chamber 200 to the carrier stage 24. The unprocessed wafers W contained within each carrier 1 conveyed to the carrier stage 24 are conveyed into the wafer boat 22 by the conveyor arm 26. The empty carriers 1 that were used to convey the wafers W are conveyed back to the second storage chamber 200 by the carrier conveyor mechanism 300.

In this manner, the wafers W contained within six carriers are conveyed to the wafer boat 22 to complete the charging of the first batch (steps (5) to (7) in FIG. 14). The wafer boat 22 containing the predetermined number of wafers W rises and is inserted into the reaction furnace 20, where the predetermined processing is performed.

While the first batch of wafers W are being processed, wafers W for the second batch are inserted into the entrance/exit portion 10 in the same manner as the first batch, are rotated through 90 degrees by the carrier reorientation mechanism 12, and are then conveyed into the first storage chamber 100 by the carrier conveyor mechanism 300 (steps (a) to (d) in FIG. 14). This sequence of operations is repeated six times to complete the acceptance of the second batch.

After the six carriers 1 for the second batch have been stored in the first storage chamber 100, the door member 120 is closed and also the box-shaped main unit 110 is brought into intimate contact with the door member 120 to seal the interior of the first storage chamber 100. Then, as described above, nitrogen is supplied from the nitrogen supply source 50 into the first storage chamber 100 so that the unprocessed wafers W contained within the carriers 1 stored in the first storage chamber 100 are immersed in a nitrogen environment of a predetermined concentration (steps (e) and (f) of FIG. 14).

After the predetermined processing has been performed on the wafers in the reaction furnace 20, one of the empty carriers 1 in the second storage chamber 200 is conveyed to the carrier stage 24 by the carrier conveyor mechanism 300, and the processed wafers W within the wafer boat 22 are conveyed into this carrier 1 by the conveyor arm 26. The carrier 1 containing these wafers W is conveyed to the second storage chamber 200 by the carrier conveyor mechanism 300 (steps (8) to (10) in FIG. 14). This sequence of operations is repeated six times until the processing and conveying of the first batch of wafers W is complete.

After the second batch of wafers W stored in the first storage chamber 100 have been immersed in the nitrogen environment for a predetermined time, the supply of nitrogen stops, the box-shaped main unit 110 moves backwards, and the door member 120 simultaneously lowers to open the first storage chamber 100. A carrier 1 within the first storage chamber 100 is then conveyed by the carrier conveyor mechanism 300 onto the carrier stage 24 and the unprocessed wafers W contained within this carrier 1 that has been conveyed to the carrier stage 24 are then conveyed to the wafer boat 22 by the conveyor arm 26. The empty carrier 1 from which the wafers W have been removed is conveyed to the first storage chamber 100 by the carrier conveyor mechanism 300.

In this manner, the wafers W contained within six carriers are conveyed to the wafer boat 22 to complete the charging of the second batch (steps (g) to (k) in FIG. 14). The wafer boat 22 containing the predetermined number of wafers W of the second batch rises and is inserted into the reaction furnace 20, where the predetermined processing is performed. After the thus processed wafers W have been conveyed to the second storage chamber 200 in the same manner as described above, they are conveyed to the entrance/exit portion 10 and removed from the apparatus.

Meanwhile, each of the carriers 1 containing the processed wafers W in the second storage chamber 200 is conveyed to the entrance/exit portion 10 by the carrier conveyor mechanism 300, is rotated through 90 degrees by the carrier reorientation mechanism 12, then is conveyed out of the apparatus (steps (11) to (14) in FIG. 14). This sequence of operations is repeated six times until the first batch of wafers W have been removed.

An empty carrier 1 in the first storage chamber 100 is then conveyed to the second storage chamber 200 by the carrier conveyor mechanism 300 (step (1) in FIG. 14). This operation is repeated six times until the transfer of the second batch of wafers W into empty carriers 1 is completed, enabling the insertion of the third batch of wafers W.

An empty carrier 1 that has been moved to the second storage chamber 200 is then conveyed by the carrier conveyor mechanism 300 to the carrier stage 24. After processed wafers W of the second batch have been conveyed into this empty carrier 1 by the conveyor arm 26, the carrier 1 containing these wafers W is conveyed by the carrier conveyor mechanism 300 from the carrier stage 24 to the first storage chamber 100 (steps (m) to (o) in FIG. 14). This sequence of operations is repeated six times until the second batch of wafers W have been removed.

Subsequently, after the third and subsequent batches of wafers W are inserted into the first storage chamber 100 and immersed in a nitrogen environment therein in the same manner, they are conveyed to the reaction furnace 20 for processing.

By processing the wafers W as described above, the unprocessed wafers W that are waiting for processing can be protected from the effects of organic substances and heavy metals in the same manner as that of the previously described operating state, and thus deterioration in the yield of completed products due to contamination of the wafers W can be prevented. Moreover, the amount of nitrogen used can be reduced to a minimum by placing only unprocessed wafers W in this nitrogen environment, enabling a reduction in the energy required for supplying the nitrogen. The wafers can also be conveyed more rapidly by using the first storage chamber 100 in addition to the second storage chamber 200 for storing the empty carriers 1 for the wafers W that are currently being processed and the carriers 1 containing processed wafers W.

It should be noted that, although the descriptions of the above embodiment concerned the application of the processing apparatus of the present invention to a vertical thermal processing furnace for semiconductor wafers, the present invention is not limited thereto. It can equally well be applied to any type of processing apparatus in which carriers containing objects to be processed are conveyed, and these objects to be processed are not limited to semiconductor wafer and could equally well be glass substrates or LCD substrates.

Since the processing apparatus in accordance with the present invention is configured as described above, the following effects can be obtained.

The processing apparatus of the present invention provides a sealed chamber in which is stored carriers containing objects to be processed and an exchange chamber communicating with this sealed chamber. Both this sealed chamber and this exchange chamber are isolated from the outer atmosphere and an inert gas is supplied thereinto. Thus not only can the environment of the objects to be processed within the processing apparatus be maintained as an inert gas environment, but also the objects to be processed can be prevented from being contaminated by organic substances and heavy metals, enabling an increase in the yield of the final products.

What is claimed is:

1. A processing apparatus, comprising:
   means for subjecting objects to be processed to a predetermined process;
   a storage portion for storing object carriers accommodating a plurality of objects to be processed;
   means for transferring object carriers into and out of said means for subjecting objects to be processed to a predetermined process and into and out of said storage portion;
   a sealed chamber for isolating an interior of said sealed chamber from an outer atmosphere, said storage portion and at least part of said means for transferring object carriers being located within said interior of said sealed chamber;
   an exchange chamber communicating with said sealed chamber for isolating an interior of said exchange chamber from the outer atmosphere, such that object carriers temporarily stored within said exchange chamber for conveyance into or out of said storage portion may be isolated from the outer atmosphere;
   an apparatus for supplying an inert gas to said interior of said sealed chamber; and
   an apparatus for supplying an inert gas to said interior of said exchange chamber.

2. The processing apparatus of claim 1, wherein:
   said means for transferring object carriers includes
   a first conveyor mechanism for conveying object carriers between an entrance/exit portion of the processing apparatus and said exchange chamber, and between said exchange chamber and said means for subjecting objects to be processed to a predetermined process;
   a second conveyor mechanism for conveying object carriers into and out of said storage portion, said second conveyor mechanism being disposed within said interior of said sealed chamber; and
   a third conveyor mechanism for transferring object carriers to and from said first conveyor mechanism or said second conveyor mechanism, said third conveyor mechanism being disposed within said interior of said sealed chamber and being provided with
      an object carrier holder portion that is capable of moving between said interior of said sealed chamber and said interior of said exchange chamber, and a first door member for sealing a communicating port between said sealed chamber and said exchange chamber when said object carrier holder portion is located within said interior of said exchange chamber.

3. The processing apparatus of claim 1, wherein:

said apparatus for supplying an inert gas to said interior of said sealed chamber includes an inert gas supply source connected to said interior of said sealed chamber through first pipeline switching means, said apparatus for supplying an inert gas to said interior of said exchange chamber includes an inert gas supply source connected to said interior of said exchange chamber through second pipeline switching means, and at least said sealed chamber is connected to an exhaust pipeline through third pipeline switching means; and said processing apparatus further includes a concentration detection means provided within said interior of said sealed chamber for detecting a predetermined gas environment concentration within said interior of said sealed chamber, and means for controlling the degree of opening of at least said first and third pipeline switching means on the basis of a signal from said concentration detection means.

4. The processing apparatus of claim 2, wherein:

an aperture for conveying object carriers into and out of said exchange chamber is provided with a second door member for opening and closing said aperture portion;

sealing members are provided around either said door members or around peripheries of said communicating port and said aperture of said exchange chamber; and each of said door members is provided with an opening/closing drive means and a pulling mechanism for pulling said door member towards said exchange chamber when said door member is closed.

5. The processing apparatus of claim 3, further including:

a second concentration detection means provided within said interior of said exchange chamber for detecting a predetermined gas environment concentration within said interior of said exchange chamber, and means for controlling the degree of opening of at least said second pipeline switching means on the basis of a signal from said second concentration detection means.

6. The processing apparatus of claim 2, further including:

a carrier stage positioned between said first conveyor mechanism and said means for subjecting objects to be processed to a predetermined process; and means for conveying object carriers between said carrier stage and said means for subjecting objects to be processed to a predetermined process;

wherein said first conveyor mechanism conveys object carriers from said exchange chamber to said carrier stage.

* * * * *